US011927036B2

(12) United States Patent
Spick et al.

(10) Patent No.: US 11,927,036 B2
(45) Date of Patent: Mar. 12, 2024

(54) DEVICE FOR DETECTING INTENTION OF LOCKING OR UNLOCKING AN OPENING ELEMENT OF A MOTOR VEHICLE WITH CAPACITIVE AND INDUCTIVE SENSORS

(71) Applicant: Vitesco Technologies GmbH, Hanover (DE)

(72) Inventors: Gabriel Spick, Toulouse (FR); Nicolas Gerard, Toulouse (FR); Bertrand Vaysse, Toulouse (FR)

(73) Assignee: VITESCO TECHNOLOGIES GMBH, Hannover (DE)

( * ) Notice: Subject to any disclaimer, the term of this patent is extended or adjusted under 35 U.S.C. 154(b) by 646 days.

(21) Appl. No.: 16/972,927

(22) PCT Filed: Jun. 7, 2019

(86) PCT No.: PCT/EP2019/064959
§ 371 (c)(1),
(2) Date: Dec. 7, 2020

(87) PCT Pub. No.: WO2019/234225
PCT Pub. Date: Dec. 12, 2019

(65) Prior Publication Data
US 2021/0246694 A1 Aug. 12, 2021

(30) Foreign Application Priority Data
Jun. 7, 2018 (FR) ........................................ 1854957

(51) Int. Cl.
*E05B 81/76* (2014.01)
*H03K 17/96* (2006.01)
*H03K 17/97* (2006.01)

(52) U.S. Cl.
CPC ........... *E05B 81/77* (2013.01); *H03K 17/962* (2013.01); *H03K 17/97* (2013.01); *H03K 2017/9706* (2013.01)

(58) Field of Classification Search
CPC .......... E05B 81/77; E05B 85/16; E05B 77/34; H03K 17/962; H03K 17/97;
(Continued)

(56) References Cited

U.S. PATENT DOCUMENTS 10,428,562 B2    10/2019  Guibbert et al.
2011/0304427 A1  12/2011  Leon et al.
(Continued)

FOREIGN PATENT DOCUMENTS

CN    102131992 A    7/2011
CN    102914800 A    2/2013
(Continued)

OTHER PUBLICATIONS

International Search Report and Written Opinion of the ISA for PCT/EP2019/064959 dated Aug. 2, 2019, 12 pages.
Office Action issued in Chinese Patent Application No. 201980052282.0 dated Oct. 30, 2023.

*Primary Examiner* — Vernal U Brown
(74) *Attorney, Agent, or Firm* — NIXON & VANDERHYE

(57) ABSTRACT

A device for detecting an intention of a user to lock or unlock an opening element of a motor vehicle includes a capacitive sensor and incorporates an inductive sensor with an amagnetic metal target moving under the action of the hand of the user on the handle or the frame, the target being associated with a coil placed in an oscillating circuit being connected to an inductive measurement circuit detecting the intention of the user to lock or unlock the opening element. The intention is only confirmed when detected by both the capacitive and inductive sensors, the target of the inductive (Continued)

sensor being borne by the electrode of the capacitive sensor and a member supporting the electrode being elastically deformable under the action of the user on the handle or the frame, the inductive and capacitive measurement circuits being independent of each other.

20 Claims, 3 Drawing Sheets

(58) Field of Classification Search
CPC ...... H03K 2217/96054; G07C 9/00182; G07C 2009/0019; G07C 9/00126; B60R 16/0207

See application file for complete search history.

(56) References Cited

U.S. PATENT DOCUMENTS

| | | |
|---|---|---|
| 2013/0033362 A1 | 2/2013 | Hourne |
| 2016/0078701 A1* | 3/2016 | Guibbert ............ G07C 9/30 340/5.72 |
| 2017/0016255 A1 | 1/2017 | Guibbert et al. |
| 2017/0269754 A1 | 9/2017 | Liu |
| 2018/0252005 A1* | 9/2018 | Magner ............ E05B 85/06 |
| 2019/0169893 A1* | 6/2019 | Scheiern ............ E05B 81/77 |

FOREIGN PATENT DOCUMENTS

| | | |
|---|---|---|
| CN | 106338772 A | 1/2017 |
| FR | 3 044 037 | 5/2017 |

* cited by examiner

DEVICE FOR DETECTING INTENTION OF LOCKING OR UNLOCKING AN OPENING ELEMENT OF A MOTOR VEHICLE WITH CAPACITIVE AND INDUCTIVE SENSORS

This application is the U.S. national phase of International Application No. PCT/EP2019/064959 filed Jun. 7, 2019 which designated the U.S. and claims priority to FR Patent Application No. 1854957 filed Jun. 7, 2018, the entire contents of each of which are hereby incorporated by reference.

BACKGROUND OF THE INVENTION

Field of the Invention

The present invention relates to a device for detecting an intention of a user to lock or unlock an opening element of a motor vehicle comprising a capacitive sensor and an inductive sensor.

The device is intended to be incorporated into a handle or into a frame of the opening element. The device comprises a voltage source, a printed circuit board and a capacitive sensor for detecting an approach of the user and/or contact of a hand of the user toward/with the handle or the frame comprising a capacitive measurement circuit and at least one member that supports an electrode that is electrically connected to the printed circuit board by said at least one member.

Description of the Related Art

Nowadays, vehicle door handles are fitted with devices for detecting the presence of a user. The detection of the presence of a user, coupled with the recognition of a "hands-free" electronic fob for remote access control carried by this user, allows the remote locking and unlocking of the opening elements of the vehicle. Thus, when the user, carrying the corresponding electronic fob identified by the vehicle, wishes to unlock the vehicle, he approaches the handle or touches the door handle of the vehicle, and the opening elements of the vehicle are then automatically unlocked. By approaching or by pressing on a precise location of the door handle of the vehicle, called "unlocking zone", the door (or alternatively all of the opening elements) is (are) unlocked without any other action from the user.

Conversely, when the user, still carrying the necessary fob identified by the vehicle, wishes to lock his vehicle, he closes the door of his vehicle and he approaches or momentarily presses on another precise location of the handle, called "locking zone". This movement makes it possible to lock the opening elements of the vehicle automatically.

These presence detection devices generally comprise two capacitive sensors, in the form of two electrodes connected electrically to a printed circuit board and integrated into the door handle, each in a precise locking or unlocking zone. Generally, one electrode is dedicated to each zone, that is to say one electrode is dedicated to detecting the approach and/or the contact of the hand of the user in the locking zone and one electrode is dedicated to detecting the approach and/or the contact of the hand of the user in the unlocking zone.

The presence detection device furthermore comprises a generally LF (low-frequency) radiofrequency antenna. The detection device is connected to the electronic computer of the vehicle (ECU: abbreviation for "electronic control unit") and sends it a presence detection signal. The electronic computer of the vehicle has, beforehand, identified the user as being authorized to access this vehicle, or alternatively, following the reception of this presence detection signal, it performs this identification. To this end, it sends an identification request to the fob (or to the remote controller) carried by the user by way of the radiofrequency antenna. This fob in response sends its identification code to the electronic computer of the vehicle through RF (radiofrequency) waves. If the electronic computer recognizes the identification code as the one authorizing access to the vehicle, it triggers the locking/unlocking of the door (or of all of the opening elements). If, on the other hand, the electronic computer has not received any identification code or if the received identification code is erroneous, locking or unlocking is not performed.

Motor vehicles are therefore equipped with opening element handles or opening element frames comprising a detection device, itself comprising a generally low-frequency radiofrequency antenna, and two electrodes connected to a microcontroller, integrated into a printed circuit and supplied with a voltage.

However, this detection device of the prior art has major drawbacks.

Specifically, the detection of the approach of a user by at least one capacitive sensor is not robust and generates false detections.

In particular, in some environmental conditions, when the ambient air is humid or when there is salt on the roads, capacitive coupling is created between the detection zone or zones, on the one hand, and the metal parts of the vehicle, on the other hand, thereby preventing any detection of the presence of a user using the capacitive sensors.

In addition, raindrops or snowflakes on the door handle increase the capacitance measured by the capacitive sensors, thus triggering false detections.

Lastly, detection by capacitive sensors is incompatible with handles coated with metallic paints or comprising chromed surfaces, the presence of metal in the handle creating coupling with the detection zones and inhibiting the detection of the presence of a user.

While, for some vehicles, false detections are not desirable, for other vehicles, false detections are not tolerable.

This is the case for vehicles fitted with deployable handles, i.e. the case of handles for which the detection of the presence of the user controls the movement of a motorized handle which, when at rest, is completely incorporated within the door and, when activated, is deployed out of the door. For this type of handle, the unwanted deployment or retraction of the handle due to a false detection by the capacitive sensors risks pinching the hand of the user.

This is also the case for vehicles provided with electrically assisted opening, for which the detection of unlocking is accompanied not only by the door being unlocked but also by its opening. In this case, false detections result in unwanted openings of the door.

Lastly, false detections are not tolerable for vehicles provided with the "safe lock" security function, for which the detection of locking controls not only the locking of the vehicle from the outside but also the locking of the vehicle from the inside (anti-theft device). In this case, false detections may lead to the user being shut inside the vehicle.

It is also known to replace at least one of the capacitive sensors with an inductive sensor comprising a metal target that moves toward a coil of the sensor during the press of the user on the locking or unlocking zone. The variation in inductance of the coil of the inductive sensor, due to the approach of the target, allows the detection of an intention of the user with regards to locking or unlocking to be validated. However, this type of sensor also has a drawback, because it is sensitive to the vibrations of the vehicle, and to the shocks generated when doors are slammed. It is therefore also liable to generate false detections.

Document FR-A-3 044 037 describes a device for detecting an intention of a user to lock or unlock a motor vehicle door, said device being incorporated within a handle. The device comprises a capacitive sensor that can also perform the role of inductive sensor by respectively comprising a coil, a movable amagnetic metal target, a first face of which is oriented toward the handle and a second face of which is located facing the coil. The movable target is able to move from a rest position, located close to the handle, to a final position, located close to the coil, under the effect of contact from the user on the handle.

The device comprises a capacitor connected to ground, the movable electrode, the coil and the capacitor being connected together in order to form a resonant circuit a resonant frequency of which varies as a function of a variation in the capacitance of the movable electrode, and as a function of the position of the movable electrode, said resonant frequency decreasing when the user approaches the handle and increasing when the user grips the handle and the electrode moves to the final position.

Means for oscillating the frequency of said resonant circuit and for measuring a resonant frequency of said resonant circuit are also present, as are means for comparing the resonant frequency with a first threshold and with a second threshold, means for controlling the frequency oscillation means, measuring means and frequency comparison means.

The device comprises means for storing times in memory, said means being able to store the first time of passage of the resonant frequency below a first threshold and a second time of passage of the resonant frequency above a second threshold. It is also equipped with means for calculating a duration between the first time and the second time and with means for comparing said duration with a predetermined duration.

In this document, no inductive sensor with its inductive measurement circuit is described, but instead a capacitive sensor whose electrode can serve as a target whose movement influences the resonant frequency of a coil. Consequently, the capacitive sensor cannot fully perform the function of inductive sensor and false detections due to interference between the capacitive measurement circuit of the capacitive sensor and the portion of the capacitive sensor that is supposed to perform a role analogous to an inductive sensor without having all of the specific means of same may occur.

In addition and more importantly, this document does not teach any satisfactory means for making an inductive sensor electrode movable so as to perform an action similar to an inductive sensor target that moves under the action of a hand of the user. The only means described in this document is a conductive flexible connection having a pivot point that electrically connects the electrode to the printed circuit board. This conductive flexible connection cannot be entirely satisfactory because it limits the movement of the electrode which is now an amagnetic metal target and thus decreases the reliability of detection by induction.

SUMMARY OF THE INVENTION

Consequently, the problem underlying the present invention is that of designing a device for detecting an intention of a user to lock and/or unlock an opening element of a motor vehicle while increasing the reliability of detection of the device and identifying false detections of an intention to lock and/or unlock.

To this end, the present invention relates to a device for detecting an intention of a user to lock or unlock an opening element of a motor vehicle, the device being intended to be incorporated into a handle or into a frame of the opening element and comprising a voltage source, a printed circuit board and a capacitive sensor for detecting an approach of the user and/or contact of a hand of the user toward/with the handle or the frame comprising a capacitive measurement circuit and at least one member that supports an electrode that is electrically connected to the capacitive measurement circuit by said at least one member, noteworthy in that the device incorporates an inductive sensor with an amagnetic metal target that is capable of moving under the action of the hand of the user on the handle or the frame, the target being associated with a coil placed in an oscillating circuit comprising at least one capacitor and having a specific resonant frequency, and being connected to an inductive measurement circuit comprising means for oscillating the oscillating circuit at a resonant frequency, means for measuring the resonant frequency and means for comparing the measured resonant frequency with a predetermined resonant-frequency threshold value, in order to detect the intention of the user to lock or unlock the opening element, said intention being confirmed only when detected both by the capacitive sensor and by the inductive sensor, the target of the inductive sensor being borne by the electrode of the capacitive sensor and said at least one member supporting the electrode being elastically deformable under the action of the hand of the user on the handle or the frame, the inductive measurement and capacitive measurement circuits being independent of one another.

In what is described, only one electrode is mentioned but it is of course possible to provide a plurality of electrodes, for example one electrode for detecting an intention to lock and one electrode for detecting an intention to unlock. While a capacitive sensor can detect an approach of the user, an inductive sensor detects only contact with a hand of the user on the handle or frame.

According to the invention, the capacitive sensor and the inductive sensor have measurement processing elements that are separate and distinct from one another, only the target and the electrode, on the one hand, and the member for supporting the target and the electrode, on the other hand, being common to both capacitive and inductive sensors. This results in complete independence of the operation of the two sensors, which the closest prior art did not provide. For example, an element of the capacitive measurement circuit may be defective and lead to the unavailability of the capacitive sensor without the operation of the inductive sensor being negatively affected and vice versa.

According to the invention, the member that supports the electrode is elastically deformable, whereas the closest prior art made provision for a conductive flexible connection having a pivot point. A member that is elastically deformable, advantageously in three dimensions, is better able to follow the deformations of the handle or of the frame that are brought about by pressure from the hand of the user than a connection that is flexible but still has a rigid component, the flexibility being in only two directions in the case of a connection.

It should be noted that the combination of a capacitive sensor and of an inductive sensor does not represent a juxtaposition of means, but provides synergy. For example, the capacitive sensor is able to detect the approach of a user, which cannot be achieved using an inductive sensor. It is then possible to vary the measurement frequency of the inductive sensor by accelerating this frequency as soon as the capacitive sensor has detected an approach, the inductive sensor being able to be in energy-saving slow operating mode for as long as the capacitive sensor has not detected this approach. Upon pressure from the hand of the user, the capacitive and inductive sensors perform fast frequency measurements in order to detect and confirm the detection of one sensor by the other, for example of the capacitive sensor by the inductive sensor.

Generally speaking, the detection device according to the invention allows reliable and robust detection of the intention to unlock or lock the vehicle that does not lead to false detections and has an inconspicuous esthetic appearance and ergonomics, allowing maximum convenience, safety and efficiency for the user.

This meets a highly pressing need given that systems that perform not only unlocking but also opening of the opening element are developing rapidly and that false intention detections absolutely need to be prescribed for such systems.

In a first preferred embodiment of the invention, said at least one member that supports the electrode of the capacitive sensor bearing the target is in the form of a leaf soldered to the printed circuit board or to the capacitive measurement circuit, an electrical connection being formed between the electrode and the capacitive measurement circuit, where appropriate, via the printed circuit board.

A soldered leaf is more flexible than a pivot connection as proposed by the closest prior art. The soldered leaf is one embodiment of the member that supports an electrode that is electrically connected to the capacitive measurement circuit, where appropriate, via the printed circuit board, by said at least one member. Specifically, a capacitive sensor provides an electrical connection between the electrode and the capacitive measurement circuit, which is not the case for an inductive sensor between the target and the inductive measurement circuit.

In second and third preferred embodiments of the invention, said at least one member that supports the electrode is in the form of a deformable foam block that bears a metallized layer forming the electrode of the capacitive sensor as well as the target of the inductive sensor, the metallized layer coating at least an external portion of the foam block that is intended to be applied against a portion of the internal wall of the handle or of the frame that deforms on contact with a hand of the user on the handle or the frame.

It is common for one or more foam blocks to be present in the handle or the frame for the purpose of retaining and protecting the detection device. These foam blocks wedge the device within the handle or the frame, preventing water infiltration with respect to detection. The contribution of the second and third preferred embodiments is to modify one or two of these foam blocks by adding to them a metallized layer forming an electrode and target, and therefore to give them an additional function with economy of means.

The foam block that forms the member for supporting the electrode is not primarily made of an electrically conductive material. It is an element incorporated into the block, for example an extension of the metallized layer or an electrically conductive metal tab internal to the foam block which forms the electrical connection between the electrode and the capacitive measurement circuit of the capacitive sensor.

In the second preferred embodiment of the invention, the deformable foam block is pierced with a passage that extends from the metallized external layer forming the electrode of the capacitive sensor to the printed circuit board of the device, a deformable and conductive tab being housed in the passage, a first longitudinal end of the tab being connected to the metallized layer and a second longitudinal end opposite the first being connected directly to the capacitive measurement circuit or indirectly via the printed circuit board.

This deformable and conductive tab represents another embodiment of the member that supports an electrode that electrically connects it to the capacitive measurement circuit.

In one optional embodiment, the metallized layer may have an area smaller than the total area of the foam block. In this way, by placing the metallized layer by lining it with foam, for example by inserting it into a cavity formed in a middle portion of the foam block, it is protected from any contact with water in the handle or the frame, the foam around the perimeter of the metallized layer forming one unit with the handle.

In the third preferred embodiment of the invention, the metallized layer extends at least partially around an external periphery of the deformable foam block with the insertion of an intermediate portion between the foam block and the printed circuit board or the capacitive measurement circuit, an electrical connection pad resting against the printed circuit board or the capacitive measurement circuit and being electrically connected directly to the capacitive measurement circuit or indirectly via the printed circuit board, the connection pad being inserted between said intermediate portion of the metallized layer and the capacitive measurement circuit or the printed circuit board, the electrode thus being connected to the capacitive measurement circuit.

In this embodiment, it is the metallized layer itself which forms the connection member for connection to the printed circuit board through its continuation which does not serve as a target in association with a pad. There is no need to perforate the foam block to form an internal passage.

Advantageously, the coil of the inductive sensor is incorporated into the printed circuit board, the printed circuit board being in the form of a printed circuit board bearing the coil on one of its faces facing the electrode of the capacitive sensor which also forms the target of the inductive sensor. The coil may be etched into the printed circuit board.

Advantageously, the printed circuit board, the coil and the inductive measurement and capacitive measurement circuits are housed in a two-portion closed housing. This makes it possible to protect the device from water infiltration or impacts. Only the metallized foam block is outside the housing in the second and third embodiments of the invention.

Advantageously, a polyurethane foam is added into the housing for protection and retention in the housing of the printed circuit board, of the coil and of the inductive and capacitive measurement circuits. This polyurethane foam should not be confused with the foam block bearing a metallized layer, and does not play any role in the electrical connection between the electrode and the capacitive measurement circuit of the capacitive sensor, and only performs a role of wedging and insulating the elements located inside the housing.

In the first preferred embodiment of the invention, the electrode, the target and said at least one member that supports the electrode bearing the target are housed in the housing.

In the second and third preferred embodiments of the invention, the metallized foam block is housed outside the housing.

The invention also relates to a method for detecting an intention of a user to lock or unlock an opening element of a motor vehicle implementing such a detection device comprising a capacitive sensor and an inductive sensor, noteworthy in that the inductive sensor is used to confirm an intention of a user to lock or unlock the opening element, which intention is detected by the capacitive sensor, a predetermined number of measurements above a capacitive threshold for the capacitive sensor and above an inductive threshold for the inductive sensor being necessary to confirm a detection, the capacitive sensor taking capacitance measurements at a higher frequency than the inductive sensor takes resonant frequency measurements when no intention is detected, the measurement frequency of the inductive sensor being just sufficient to establish a resonant-frequency reference line without movement of the target and when the capacitive sensor has detected an approach of a user which may lead to an intention to unlock, the measurement frequency of the inductive sensor is increased to be substantially equal to the frequency of the capacitive sensor with a range of variation of +/−10% around this measurement frequency.

According to the method according to the present invention, a synergy is established between the operation of a capacitive sensor and the operation of an inductive sensor. To start with, in a phase of the user approaching, only the capacitive sensor performs detection measurements, the inductive sensor performing resonant-frequency calibration measurements in order to determine a resonant-frequency threshold value. When an approach of a user is detected by the capacitive sensor according to the present invention, through interaction, the inductive sensor is woken up and no longer operates in slow mode, and performs measurements at an accelerated frequency. Thus, the measurements of the capacitive sensor are disconfirmed or confirmed by the inductive sensor and reliability of the measurements of the detection device is increased.

The solution proposed by the present invention consists in using an inductive sensor and a capacitive sensor in the same detection area by combining the electrode of the capacitive sensor with the target of the inductive sensor. The two sensors are connected to two independent electronic circuits and can therefore take capacitive and inductive measurements independently. The measurements may be taken sequentially in order to avoid interference between the two sensors. Detection occurs only if both sensors see a signal variation, which strengthens the reliability of the measurement.

Such a method according to the present invention makes it possible to have a detection device that prevents false detections and that makes it possible to have redundancy in the measurements for detecting an intention to lock or unlock.

What has been stated above relates to unlocking but may be easily transposed to locking, with the difference that the detection of the approach of the user is no longer necessary. Lastly, the invention relates to a handle or a frame of an opening element of a motor vehicle that has an internal cavity, noteworthy in that the handle or the frame houses such a detection device, the electrode being in contact with a portion of an internal wall of the handle or of the frame that delimits the internal cavity.

Advantageously, at least one wedging foam is inserted between a portion of the internal wall of the handle or of the frame and the detection device, the wedging foam being coated with a metallized layer so as to act as said at least one member that supports the electrode.

BRIEF DESCRIPTION OF THE DRAWINGS

Other features, aims and advantages of the present invention will become apparent on reading the detailed description that follows and on examining the appended drawings given by way of non-limiting example, and in which.

DESCRIPTION OF THE PREFERRED EMBODIMENTS

In what follows, no specific reference is used for the target of the inductive sensor since this target is combined with the electrode 10 of the capacitive sensor.

Figure 1:
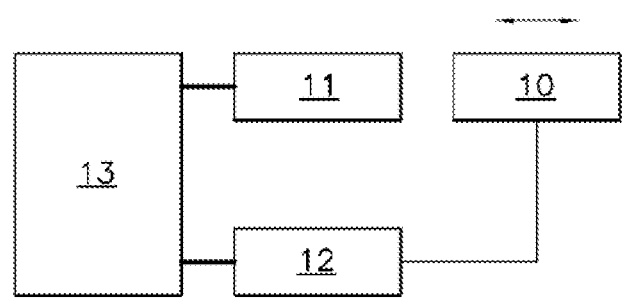
FIG. 1 schematically shows an assembly of a printed circuit board, capacitive measurement circuit, inductive measurement circuit and capacitive electrode which also forms an inductive target of a device for detecting an intention to lock and/or unlock according to the present invention.
Figure 2:
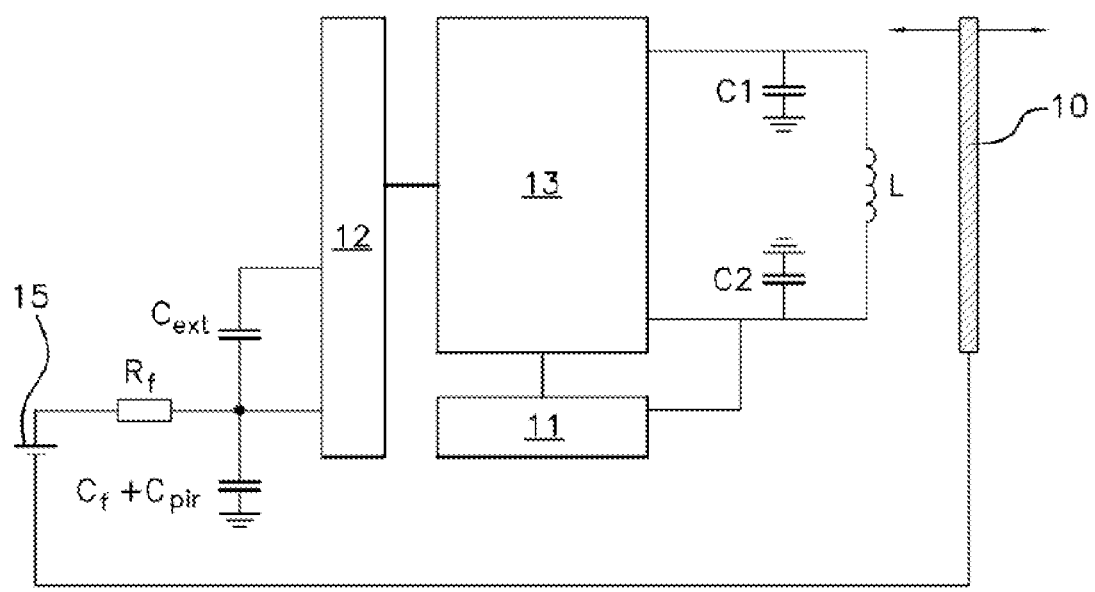
FIG. 2 schematically shows the assembly according to FIG. 1 with detail of the elements of the capacitive measurement circuit and of the inductive measurement circuit according to one embodiment of the detection device according to the present invention.
Figure 3:
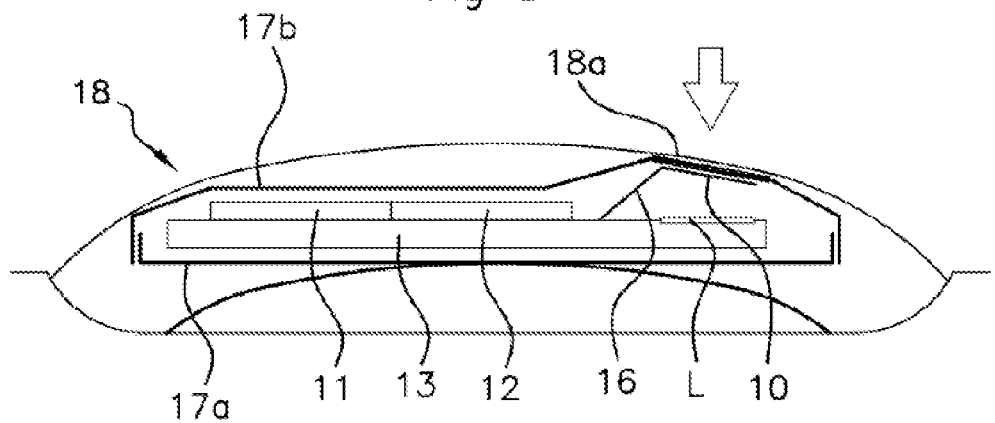
FIGS. 3 to 5 schematically show longitudinal sectional views of a handle of an opening element equipped with a detection device according to three alternative preferred embodiments of the present invention.
Figure 4:
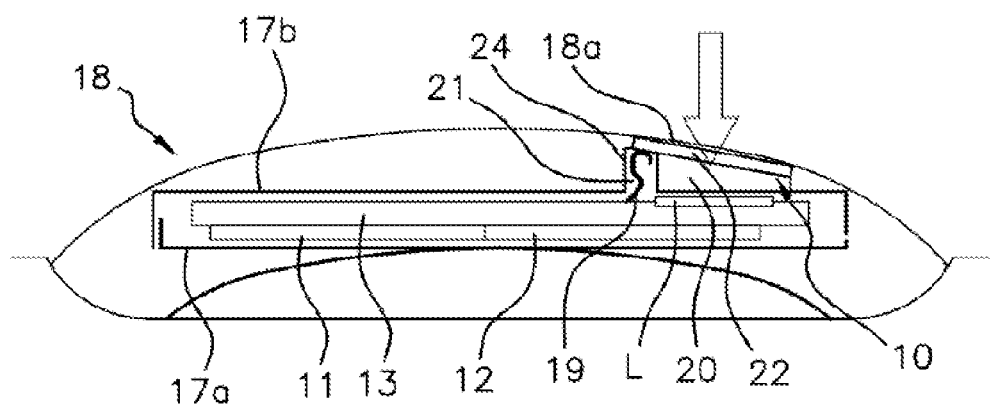
Figure 5:
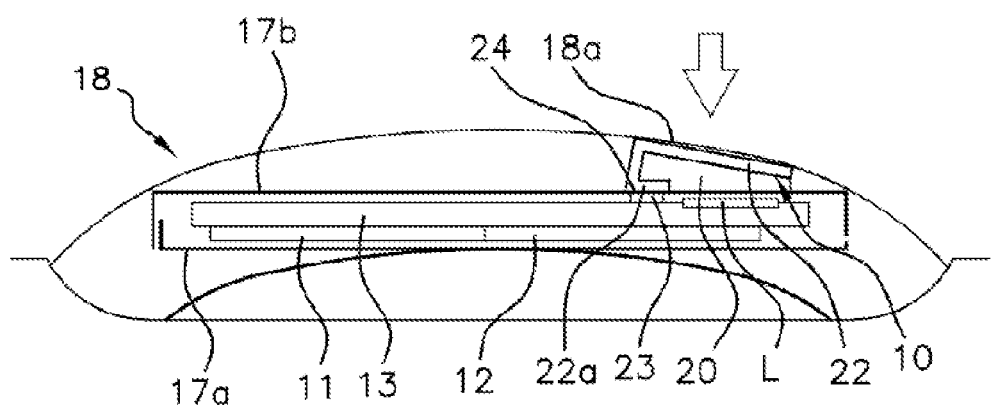

Referring more particularly to FIGS. 1 to 5, the present invention relates to a device for detecting an intention of a user to lock or unlock an opening element of a motor vehicle, the device being intended to be incorporated into a handle 18 or into a frame of the opening element, a handle 18 being shown in FIGS. 3 to 5.

The device comprises a voltage source, a printed circuit board 13 and a capacitive sensor for detecting contact with a hand of the user on the handle 18 or the frame comprising a capacitive measurement circuit 12 and at least one member 16, 20 that supports an electrode 10 that is electrically connected to the printed circuit board 13 by said at least one member 16, 20.

These features are the usual features of a capacitive sensor. There may be a first member 16, 20 for a first electrode 10 that detects an intention to unlock and a second member for a second electrode that detects an intention to lock, the first and second electrodes potentially being associated with different detection areas.

Specifically, in a capacitive sensor, there may be a first electrode 10 for detecting an intention to unlock and a second electrode for detecting an intention to lock, a single electrode 10 being shown in FIGS. 1 to 5.

FIG. 2 shows an electrode 10 connected to a voltage source in a circuit comprising a resistor Rf. A first capacitor Cext is connected by a first branch to the capacitive measurement circuit 12, which is itself connected to a printed circuit board 13 comprising a microprocessor. A second branch comprising at least one second capacitor, advantageously two capacitors Cf, Cpir, is connected to ground by branching off from the first branch.

The capacitive measurement circuit 12 measures the capacitance at the terminals of each first or second electrode 10 in order to detect the presence, that is to say the approach and/or the contact of a user toward/in the detection areas, that is to say in a locking area or in an unlocking area in association with the microprocessor incorporated into the printed circuit board 13.

According to the present invention, the detection device incorporates an inductive sensor with an amagnetic metal target that is capable of moving under the action of the hand of the user on the handle 18 or the frame. The target is associated with a coil L situated in an oscillating circuit comprising at least one capacitor C1, C2 and having a specific resonant frequency, and being connected to an inductive measurement circuit 11. This forms an inductive sensor.

The inductive measurement circuit 11 comprises means for oscillating the oscillating circuit at a resonant frequency, means for measuring the resonant frequency and means for comparing the measured resonant frequency with a predetermined resonant-frequency threshold value, in order to detect the intention of the user to lock or unlock the opening element when the measured resonant frequency differs from the predetermined resonant-frequency threshold value.

The metal target of the inductive sensor may be formed by an aluminum part. The metal target is able to move closer to the coil L when the user applies pressure in the detection area. This metal part is not electrically connected to the inductive measurement circuit 11, only the coil L being so.

The target of the inductive sensor is also used as a capacitive approach-detection electrode 10. The electrode is also electrically connected to the capacitive electronic measurement circuit 12.

FIG. 2 shows a coil L which may be printed onto the printed circuit board 13. The coil L may be etched onto or into the printed circuit board 13. The coil L is associated with two capacitors C1 and C2 in parallel, each connected to ground.

The inductive measurement circuit 11 is connected to the printed circuit board 13 and is independent of the capacitive measurement circuit 12. Only the electrode 10 forming the target is common to the capacitive and inductive sensors.

An intention to lock or unlock is confirmed only when detected both by the capacitive sensor and by the inductive sensor.

The target of the inductive sensor is borne by the electrode 10 of the capacitive sensor and the member 16, 20 that supports the electrode 10 or each electrode in the case of two electrodes is elastically deformable under the action of the hand of the user on the handle 18 or the frame.

For simplification in FIGS. 3 to 5, the electronics connected to the printed circuit board 13 forming the capacitive measurement circuit 12 and the inductive measurement circuit 11 is shown above or below the printed circuit board 13, the two capacitive 12 and inductive 11 measurement circuits being shown next to one another. This is not limiting.

In all of the embodiments, the coil L of the inductive sensor may be incorporated into the printed circuit board 13. The printed circuit board 13 may be in the form of a printed circuit board 13 that bears the coil L on one of its faces facing the electrode 10 of the capacitive sensor which also forms the target of the inductive sensor.

FIGS. 3 to 5 show a member for supporting the electrode 10 being connected to the printed circuit board 13. This is not limiting, the important thing being that the electrode 10 is electrically connected to the capacitive measurement device 12 in order to make the capacitive sensor operational. This may be done directly or indirectly via the printed circuit board 13, which is shown in FIGS. 3 to 5 but is not limiting.

With reference to FIG. 3, in a first preferred embodiment of the invention, each member 16 that supports an electrode 10 of the capacitive sensor bearing the target of the inductive sensor may be in the form of a leaf 16 soldered to the printed circuit board 13, the soldered leaf 16 being electrically connected to the capacitive measurement circuit 12. The electrode 10 may form a single piece with the soldered leaf 16 or be connected to the soldered leaf 16. The soldered leaf 16 could be soldered to the capacitive measurement circuit 12.

A housing 17a, 17b in two portions which partially fit into one another encloses the entire detection device, electrode 10 and target included. The coil L is located beneath the electrode 10 and is etched into the printed circuit board 13. The detection device is surrounded by a layer of plastic material, advantageously a polyurethane foam in the housing 17a, 17b. The polyurethane foam is added into the housing 17a, 17b for protection and retention in the housing 17a, 17b of the printed circuit board 13, of the coil L and of the inductive and capacitive measurement circuits. The soldered leaf 16 is made of an electrically conductive material.

In second and third preferred embodiments of the invention, shown in FIGS. 4 and 5, the member 20, or each member 20. that supports the electrode 10 that also forms an amagnetic metal target is in the form of a deformable foam block 20 bearing a metallized layer 22 which forms the electrode 10 of the capacitive sensor as well as the target of the inductive sensor.

In FIG. 4, the metallized layer 22 is limited to the active portion of the electrode 10 and of the target used for detection. This metallized layer 22 coats at least an external portion of the foam block 20 that is intended to be applied against a portion of the internal wall 18a of the handle 18 or of the frame that deforms on contact with a hand of the user on the handle 18 or the frame, the action of contact pressure being applied being illustrated by the arrow.

Since this metallized layer 22 is limited to the active portion of the electrode 10 and is therefore located on an opposite face of the foam block 20 to the face of the foam block 20 that rests directly or indirectly against the capacitive measurement circuit 12 or the printed circuit board 13, in the second preferred embodiment of the invention shown in FIG. 4, the deformable foam block 20 may be pierced with a passage 21 that extends from the metallized outer layer forming the electrode 10 of the capacitive sensor to the capacitive measurement circuit 12 or the printed circuit board 13 of the device and opens out onto the capacitive measurement circuit 12 or the printed circuit board 13.

In this second embodiment, a deformable and conductive tab 19 may be accommodated by being inserted into the passage 21. A first longitudinal end of the tab 19 may be connected to the metallized layer 22 by being curved so as to have an increased contact area with the internal face of the metallized layer 22. A second longitudinal end opposite the first may be connected to the capacitive measurement circuit 12 or to the printed circuit board 13, for example by being soldered to the capacitive measurement circuit 12 or the printed circuit board 13. The tab 19 may be offset with respect to the coil L so as not to come between the coil L and the electrode 10 that forms the target. Directly or indirectly, the metallized layer 22, via the tab 19, is electrically connected to the capacitive measurement circuit 12, where appropriate via the printed circuit board 13.

In this second embodiment, the capacitive 12 and inductive 11 measurement circuits are located on the face of the printed circuit board 13 opposite the face of the circuit that is connected to the tab 19, which is not limiting.

In this second preferred embodiment of the invention like in the third preferred embodiment of the invention, similar to the first embodiment, the detection device is at least partially housed in a housing 17a, 17b formed of two portions that are partially nested within one another, the rest of the housing 17a, 17b also being filled with a plastic material such as polyurethane.

The difference with the first embodiment is that the foam block 20 and the metallized layer 22 are located outside the housing 17a, 17b. In the second embodiment, the housing 17a, 17b has a void 24 for the passage for the end of the tab 19 that is connected to the printed circuit board 13, this void 24 being covered by the foam block 20 in order to seal the housing 17a, 17b from the exterior.

With reference to FIG. 5, in the third preferred embodiment of the invention, the metallized layer 22 may extend at least partially around an external periphery of the deformable foam block 20 with the insertion of an intermediate portion 22a between the foam block 20 and the printed circuit board 13. An electrical connection pad 23 is added which rests against and is connected to the printed circuit board 13 and is inserted between said intermediate portion 22a of the metallized layer 22 and the printed circuit board 13, this pad 23 forming the electrical connection between the metallized layer 22 and the printed circuit board 13. Instead of the printed circuit board, the pad 23 may be connected to the capacitive measurement circuit 12, the important thing being that the electrode 10 is electrically connected to the capacitive measurement circuit 12.

The pad 23 may be housed in the housing 17a, 17b while the intermediate portion 22a of the metallized layer 22 is located in front of a void 24 for the passage 21 made in the housing 17a, 17b. Like for the second embodiment with regard to the tab 19, the intermediate portion 22a may be offset with respect to the superposition of the active portion of the metallized layer 22 that forms electrode 10 and target and the coil L.

The invention also relates to a method for detecting an intention of a user to lock or unlock an opening element of a motor vehicle implementing a detection device comprising a capacitive sensor and an inductive sensor as described above.

The inductive sensor may serve to confirm an intention of a user to lock or unlock the opening element as detected by the capacitive sensor, advantageously in a phase of the user approaching that an inductive sensor is unable to detect. Before such an approach detection, the inductive sensor is not in measurement operating mode but in an operating mode for updating the resonant-frequency threshold value while operating in slow mode.

In an approach phase, the capacitive sensor takes capacitance measurements at a higher frequency than the inductive sensor takes resonant-frequency measurements when no intention has been detected, the measurement frequency of the inductive sensor being just sufficient to establish a resonant-frequency reference line without movement of the target.

After detecting an approach phase which should normally result in contact with the hand of the user on the handle 18 or the frame of the opening element, a predetermined number of measurements above a capacitive threshold for the capacitive sensor and above an inductive threshold for the inductive sensor are then necessary to confirm detection.

Once the capacitive sensor has detected an approach of the user that may result in an intention to unlock, the measurement frequency of the inductive sensor is increased to be substantially equal to the frequency of the capacitive sensor with a range of variation of +/−10% around this measurement frequency. The inductive sensor then performs a measurement function in order to detect an intention to unlock.

For a locking action, a number of measurements from both sensors is necessary to perform this locking, the inductive sensor then switching to slow operating mode with a decreased measurement frequency that is just sufficient for updating the resonance frequency.

Adaptations may take place. If one of the two sensors is recognized as being defective, only the measurements from the other sensor are taken into account in a period of defective operation. The number of confirmation measurements may be variable and depend on the prevailing weather conditions which influence the detection by a sensor, in particular the capacitive sensor.

Figure 6:
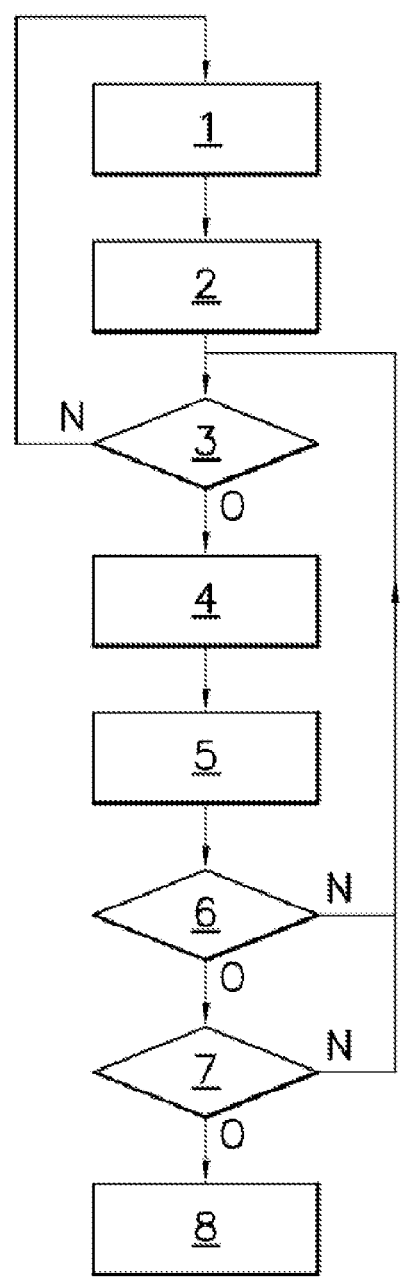
FIG. 6 shows a flowchart of one embodiment of a method for detecting an intention to lock according to the present invention.

A flowchart of one embodiment of the detection method is shown in FIG. 6. Reference will be made to the other figures for the references missing from FIG. 6 which are mentioned below.

First, a capacitive measurement is taken in step 1 by the capacitive sensor. These measurements are taken for example every 15 to 20 milliseconds. This measurement relates to a detection of the approach of a user.

In step 2, an inductive measurement is taken by the inductive sensor. This is done by activating the oscillations of the inductive measurement circuit 11 at its resonant frequency and then measuring the resonant frequency. The measurement period is long for as long as an approach has not been detected by the capacitive sensor, for example it is one second or several seconds.

The measurements are taken not for detection but in order to have the resonant frequency by default and to update it. These measurements are taken for example every three seconds in order to save energy. The inductive sensor operates in slow mode. This makes it possible to decrease the consumption of the inductive sensor, which is not able to take measurements for detecting the approach of the user.

A capacitive threshold representative of a detection of the approach of the user has been predetermined beforehand. In step 3, a comparison is made between the capacitive measurement taken and the predetermined capacitive threshold. If the capacitive measurement taken is higher than the predetermined capacitive threshold which is shown by the output O, a capacitive measurement is taken in step 4 and then an inductive measurement is taken in step 5 with a very short accelerated intensive period and a high frequency both for capacitive measurements and for the accelerated and intensive inductive measurements, for example of 2 milliseconds.

The inductive sensor then no longer operates to update the resonant frequency but to take inductive measurements. It is no longer the approach of the user which is followed but the contact with the hand of the user on the handle 18 or the frame of the opening element which is detected.

Conversely, if the capacitive measurement taken is lower than the predetermined capacitive threshold, which is shown by the output N, a capacitive approach-detection measurement is taken again in 1 with a short period of 20 milliseconds but not intensively, and accelerated. The inductive sensor then operates in slow mode.

An inductive threshold representative of a detection of contact with the hand of the user with the handle 18 or the frame has been predetermined beforehand.

In the step, a comparison is made between the inductive measurement taken and the predetermined inductive threshold. If the inductive measurement taken is lower than the predetermined inductive threshold which is shown by the output N, it returns to step 3 in order to compare a capacitive measurement taken with the predetermined capacitive threshold, it having been concluded that the user is not in contact with the handle 18 or the frame, and in order to detect a phase of the user approaching.

If the inductive measurement taken is higher than the predetermined inductive threshold, which is shown by the output O, confirming measurements, both capacitive and inductive, are taken in step 7 X for confirmation.

If this confirmation is not obtained, which is shown by the output N, it returns to step 3. If this confirmation is obtained, which is shown by the output O, it is concluded in step 8 that there is detection.

For example, if the number X is equal to 1, if the capacitive sensor detects a capacitive approach and then the inductive sensor detects pressure from the hand of the user on the handle or the frame within a predetermined time period, then a detection of an intention to lock is confirmed.

If only one of the two sensors observes a variation, then the detection is not recognized. The detection device is muted for a defined time.

The confirmation state is sent to a unit for controlling the locking or unlocking of the opening elements of the motor vehicle which unlocks the opening element.

The inductive sensor is able to detect an impact on the target and to have previously stored an impact threshold. If the impact threshold is crossed on the inductive sensor, it means that the pressing force is abnormally high. This signature may come from an impact with the sensor or with the motor vehicle. In this case, detection does not occur and the inductive sensor is muted for a defined time. Muting one of the sensors avoids detecting any bouncing of the signal that exceeds the detection threshold corresponding to false detections.

Referring more particularly to FIGS. 3 to 5, the invention lastly relates to a handle 18 or a frame of an opening element of a motor vehicle that has an internal cavity housing a detection device as described above. In FIGS. 3 to 5, only a handle 18 is shown but what is stated applies for a frame.

As can be seen in these figures, the electrode 10 is in contact with a portion of an internal wall 18a of the handle 18 or of the frame that delimits the internal cavity. In FIGS. 3 to 5, the arrow pointing at the portion of the external wall corresponding to the portion 18a of the inner wall of the handle 18 indicates the direction in which the hand of the user applies pressure to the handle 18.

At least one wedging foam may be inserted between a portion of the internal wall of the handle 18 or of the frame and the detection device. As shown in FIGS. 3 to 5, it may be this wedging foam which is coated with a metallized layer 22 in order to act as at least one member 16, 20 that supports the electrode 10 and the electrode 10 that forms the target.

The invention claimed is:

1. A device for detecting an intention of a user to lock or unlock an opening element of a motor vehicle, the device being intended to be incorporated into a handle (18) or into a frame of the opening element and comprising a voltage source, a printed circuit board (13) and a capacitive sensor for detecting contact with a hand of the user on the handle (18) or the frame comprising a capacitive measurement circuit (12) and at least one member (16, 20) that supports an electrode (10) that is electrically connected to the capacitive measurement circuit (12) by said at least one member (16, 20), wherein the device incorporates an inductive sensor with an amagnetic metal target that is capable of moving under the action of the hand of the user on the handle (18) or the frame, the target being associated with a coil (L) placed in an oscillating circuit comprising at least one capacitor and having a specific resonant frequency, and being connected to an inductive measurement circuit (11) comprising means for oscillating the oscillating circuit at a resonant frequency, means for measuring the resonant frequency and means for comparing the measured resonant frequency with a predetermined resonant-frequency threshold value, in order to detect the intention of the user to lock or unlock the opening element, said intention being confirmed only when detected both by the capacitive sensor and by the inductive sensor, the target of the inductive sensor being borne by the electrode (10) of the capacitive sensor and said at least one member (16, 20) supporting the electrode (10) being elastically deformable under the action of the hand of the user on the handle (18) or the frame, the inductive measurement (11) and capacitive measurement (12) circuits being independent of one another.

2. The detection device as claimed in claim 1, wherein said at least one member (16, 20) that supports the electrode (10) of the capacitive sensor bearing the target is in the form of a leaf (16) soldered to the printed circuit board (13) or to the capacitive measurement circuit (12), an electrical connection being formed between the electrode (10) and the capacitive measurement circuit (12), where appropriate, via the printed circuit board (13).

3. The detection device as claimed in claim 2, wherein the printed circuit board (13), the coil (L) and the inductive measurement (11) and capacitive measurement (12) circuits are housed in a two-portion closed housing (17a, 17b).

4. The detection device as claimed in claim 3, wherein a polyurethane foam is added into the housing (17a, 17b) for protection and retention in the housing (17a, 17b) of the printed circuit board (13), of the coil (L) and of the inductive (11) and capacitive (12) measurement circuits.

5. The detection device as claimed in claim 3, wherein the electrode (10), the target and said at least one member (16) that supports the electrode (10) bearing the target are housed in the housing (17a, 17b).

6. The detection device as claimed in claim 2, wherein the coil (L) of the inductive sensor is incorporated into the printed circuit board (13), the printed circuit board (13) being in the form of a printed circuit board (13) bearing the coil (L) on one of a face facing the electrode (10) of the capacitive sensor which also forms the target of the inductive sensor.

7. The detection device as claimed in claim 1, wherein said at least one member (16, 20) that supports the electrode (10) is in the form of a deformable foam block (20) that bears a metallized layer (22) forming the electrode (10) of the capacitive sensor as well as the target of the inductive sensor, the metallized layer (22) coating at least an external portion of the foam block (20) that is intended to be applied against a portion of the internal wall (18a) of the handle (18) or of the frame that deforms on contact with a hand of the user on the handle (18) or the frame.

8. The detection device as claimed in claim 7, wherein the deformable foam block (20) is pierced with a passage (21) that extends from the metallized external layer forming the electrode (10) of the capacitive sensor to the printed circuit board (13) of the device, a deformable and conductive tab (19) being housed in the passage (21), a first longitudinal end of the tab (19) being connected to the metallized layer (22) and a second longitudinal end opposite the first being connected directly to the capacitive measurement circuit (12) or indirectly via the printed circuit board (13).

9. The detection device as claimed in claim 8, wherein the coil (L) of the inductive sensor is incorporated into the printed circuit board (13), the printed circuit board (13) being in the form of a printed circuit board (13) bearing the coil (L) on one of a face facing the electrode (10) of the capacitive sensor which also forms the target of the inductive sensor.

10. The detection device as claimed in claim 8, wherein the printed circuit board (13), the coil (L) and the inductive measurement (11) and capacitive measurement (12) circuits are housed in a two-portion closed housing (17a, 17b).

11. The detection device as claimed in claim 7, wherein the metallized layer (22) extends at least partially around an external periphery of the deformable foam block (20) with the insertion of an intermediate portion (22a) between the foam block (20) and the printed circuit board (13) or the capacitive measurement circuit (12), an electrical connection pad (23) resting against the printed circuit board (13) or the capacitive measurement circuit (12) and being electrically connected directly to the capacitive measurement circuit (12) or indirectly via the printed circuit board (13), the connection pad (23) being inserted between said intermediate portion (22a) of the metallized layer (22) and the capacitive measurement circuit (12) or the printed circuit board (13), the electrode (10) thus being connected to the capacitive measurement circuit (12).

12. The detection device as claimed in claim 11, wherein the coil (L) of the inductive sensor is incorporated into the printed circuit board (13), the printed circuit board (13) being in the form of a printed circuit board (13) bearing the coil (L) on one of a face facing the electrode (10) of the capacitive sensor which also forms the target of the inductive sensor.

13. The detection device as claimed in claim 7, wherein the printed circuit board (13), the coil (L) and the inductive measurement (11) and capacitive measurement (12) circuits are housed in a two-portion closed housing (17a, 17b), and wherein the metallized foam block (20) is housed outside the housing (17a, 17b).

14. The detection device as claimed in claim 7, wherein the coil (L) of the inductive sensor is incorporated into the printed circuit board (13), the printed circuit board (13) being in the form of a printed circuit board (13) bearing the coil (L) on one of a face facing the electrode (10) of the capacitive sensor which also forms the target of the inductive sensor.

15. The detection device as claimed in claim 7, wherein the printed circuit board (13), the coil (L) and the inductive measurement (11) and capacitive measurement (12) circuits are housed in a two-portion closed housing (17a, 17b).

16. The detection device as claimed in claim 1, wherein the coil (L) of the inductive sensor is incorporated into the printed circuit board (13), the printed circuit board (13) being in the form of a printed circuit board (13) bearing the coil (L) on one of a face facing the electrode (10) of the capacitive sensor which also forms the target of the inductive sensor.

17. A handle (18) or frame of an opening element of a motor vehicle that has an internal cavity, wherein the handle (18) or the frame houses a detection device as claimed in claim 1, the electrode (10) being in contact with a portion of an internal wall (18a) of the handle (18) or of the frame that delimits the internal cavity.

18. The handle (18) or frame as claimed in claim 17, wherein at least one wedging foam is inserted between a portion of the internal wall of the handle (18) or of the frame and the detection device, the wedging foam being coated with a metallized layer (22) so as to act as said at least one member (20) that supports the electrode (10).

19. The detection device as claimed in claim 1, wherein the printed circuit board (13), the coil (L) and the inductive measurement (11) and capacitive measurement (12) circuits are housed in a two-portion closed housing (17a, 17b).

20. A method for detecting an intention of a user to lock or unlock an opening element of a motor vehicle implementing a detection device as claimed in claim 1 comprising a capacitive sensor and an inductive sensor, wherein the inductive sensor is used to confirm an intention of a user to lock or unlock the opening element, which intention is detected by the capacitive sensor, a predetermined number of measurements above a capacitive threshold for the capacitive sensor and above an inductive threshold for the inductive sensor being necessary to confirm a detection, the capacitive sensor taking capacitance measurements at a higher frequency than the inductive sensor takes resonant frequency measurements when no intention is detected, the measurement frequency of the inductive sensor being just sufficient to establish a resonant-frequency reference line without movement of the target and when the capacitive sensor has detected an approach of a user which may lead to an intention to unlock, the measurement frequency of the inductive sensor is increased to be substantially equal to the frequency of the capacitive sensor with a range of variation of +/−10% around this measurement frequency.

* * * * *